(12) United States Patent
Standiford et al.

(10) Patent No.: US 7,241,991 B1
(45) Date of Patent: Jul. 10, 2007

(54) REGION-OF-INTEREST BASED ELECTRON BEAM METROLOGY

(75) Inventors: Keith Standiford, Carmel, CA (US); Mark A. Neil, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 11/271,122

(22) Filed: Nov. 9, 2005

Related U.S. Application Data

(60) Provisional application No. 60/712,313, filed on Aug. 30, 2005.

(51) Int. Cl.
H01L 21/00 (2006.01)
H01J 37/26 (2006.01)

(52) U.S. Cl. ............... 250/306; 250/307; 250/310; 250/492.2; 250/492.3

(58) Field of Classification Search ............... None
See application file for complete search history.

(56) References Cited

U.S. PATENT DOCUMENTS

| | | | |
|---|---|---|---|
| 4,449,051 A | 5/1984 | Berkowitz | |
| 4,588,890 A | 5/1986 | Finnes | |
| 4,898,471 A | 2/1990 | Stonestrom et al. | |
| 5,076,692 A | 12/1991 | Neukermans et al. | |
| 5,302,828 A | 4/1994 | Monahan | |
| 5,493,116 A | 2/1996 | Toro-Lira et al. | |
| 5,712,701 A | 1/1998 | Clementi et al. | |
| 5,825,482 A | 10/1998 | Nikoonahad et al. | |
| 5,864,394 A | 1/1999 | Jordan, III et al. | |
| 5,869,833 A | 2/1999 | Richardson et al. | |
| 5,872,358 A * | 2/1999 | Todokoro et al. | 250/310 |
| 6,066,849 A | 5/2000 | Masnaghetti et al. | |
| 6,081,325 A | 6/2000 | Leslie et al. | |
| 6,118,525 A | 9/2000 | Fossey et al. | |
| 6,169,601 B1 | 1/2001 | Eremin et al. | |
| 6,215,551 B1 | 4/2001 | Nikoonahad et al. | |
| 6,292,259 B1 | 9/2001 | Fossey et al. | |
| 6,472,662 B1 | 10/2002 | Archie | |
| 6,486,946 B1 | 11/2002 | Stover et al. | |
| 6,509,965 B2 | 1/2003 | Fossey et al. | |
| 6,815,675 B1 | 11/2004 | Lorusso et al. | |
| 6,891,627 B1 | 5/2005 | Levy et al. | |
| 2002/0024012 A1* | 2/2002 | Abe et al. | 250/311 |
| 2003/0010914 A1* | 1/2003 | Takane et al. | 250/310 |
| 2004/0247172 A1* | 12/2004 | Mitsui | 382/141 |

\* cited by examiner

*Primary Examiner*—Nikita Wells
(74) *Attorney, Agent, or Firm*—Okamoto & Benedicto LLP

(57) ABSTRACT

One embodiment relates to a method for metrology using an electron beam apparatus. At least one region of interest is selected in a field of view at a magnification level. Scanning parameters are determined to selectively scan over the at least one regions of interest under the magnification level of the field of view. The electron beam is selectively scanned over the at least one region of interest to capture image data from the at least one region of interest while maintaining the magnification level of the field of view. Other embodiments are also disclosed.

11 Claims, 8 Drawing Sheets

| Field Size (pixels) | 512 x 512 (conventional) | 64 x 64 (ROI Metrology) |
|---|---|---|
| Total Pixels | 256 K | 4 K per measurement |
| Frame Acquisition Time | 8 msec | 0.3 msec |
| Total Acquisition Time (64 frames) | 0.5 sec | 20 msec |
| Acquisition Time Change | - | 1/27 x |

FIG. 3

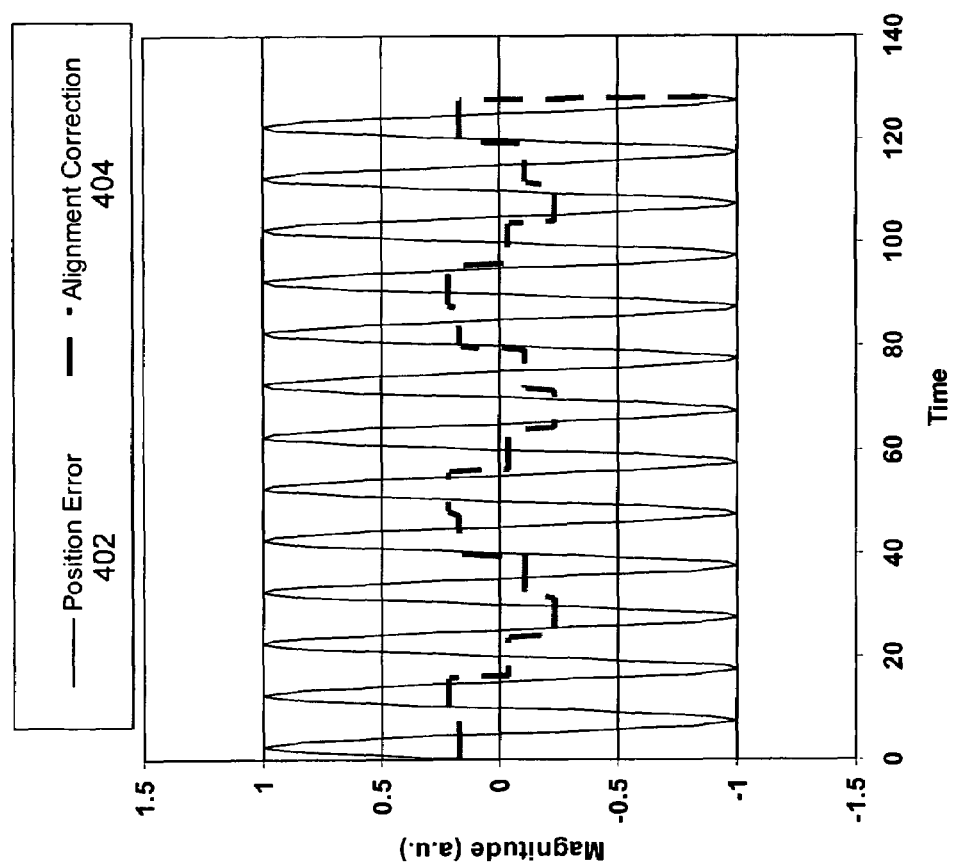
FIG. 4
(Conventional)

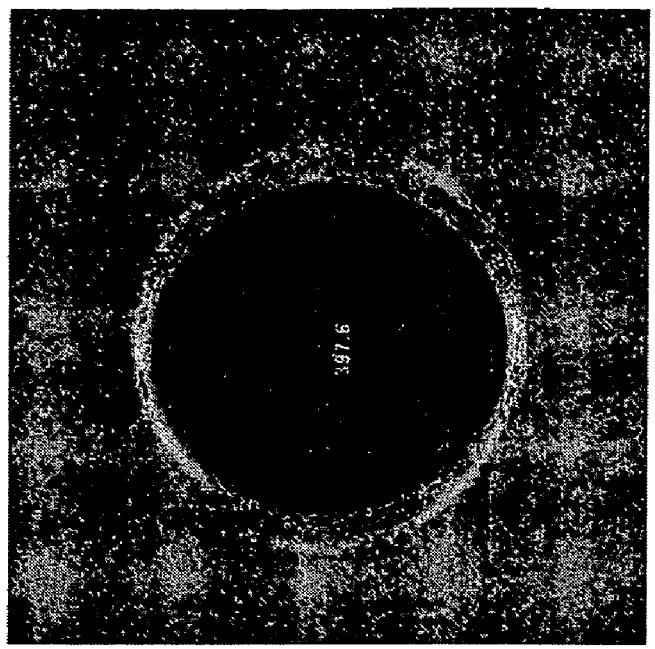
With shot noise and vibration preventing proper alignment
604
FIG. 6
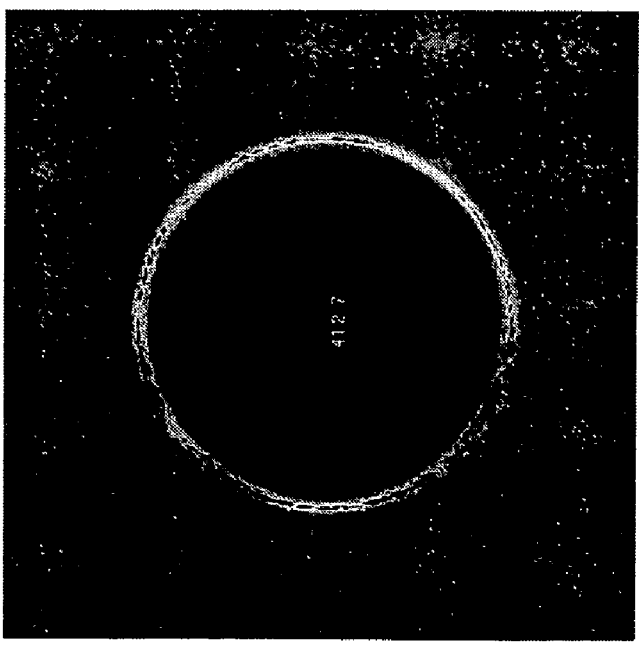
Ideal alignment
602

REGION-OF-INTEREST BASED ELECTRON BEAM METROLOGY

CROSS-REFERENCE TO RELATED APPLICATIONS

The present invention claims the benefit of U.S. Provisional Patent Application No. 60/712,313 entitled "Region-of-Interest Based Electron Beam Metrology," filed Aug. 30, 2005 by inventors Keith Standiford and Mark A. Neil, the disclosure of which is hereby incorporated by reference.

BACKGROUND OF THE INVENTION

1. Field of the Invention

The present invention relates generally to metrology, and more particularly to electron beam metrology in the semiconductor manufacturing and microfabrication industries.

2. Description of the Background Art

Fabrication of semiconductor devices such as logic and memory devices typically includes a number of processes that may be used to form various features and multiple levels or layers of semiconductor devices on a surface of a semiconductor wafer or another appropriate substrate. For example, lithography is a process that typically involves transferring a pattern to a resist arranged on a surface of a semiconductor wafer. Additional examples of semiconductor fabrication processes may include chemical-mechanical polishing, etch, deposition, ion implantation, plating, and cleaning. Semiconductor devices are significantly smaller than a typical semiconductor wafer or substrate, and an array of semiconductor devices may be formed on a semiconductor wafer. After processing is complete, the semiconductor wafer may be separated into individual semiconductor devices.

Semiconductor fabrication processes, however, are among the most sophisticated and complex processes used in manufacturing. In order to perform efficiently, semiconductor fabrication processes may require frequent monitoring and careful evaluation. In particular, many dimensional aspects of these fabrication processes must be carefully controlled, such as line or space widths, hole dimensions or areas, rounding of corners, or shrinkage of line ends. Semiconductor fabrication processes may introduce a number of deviations from these desired dimensions into a semiconductor device. As an example, variations in lithographic exposure levels may cause deviations in printed line widths. Such deviations may adversely affect the performance of the process to an extent that overall yield of the fabrication process may be reduced below acceptable levels. Therefore, extensive monitoring and evaluation of semiconductor fabrication processes may typically be performed to ensure that the process is within design tolerance and to increase the overall yield of the process. Extensive monitoring and evaluation of the process may take place both during process development and during process control of semiconductor fabrication processes.

As the dimensions of semiconductor devices continue to shrink with advances in semiconductor materials and processes, the ability to examine microscopic features and to detect dimensional deviations has also become increasingly important to the successful fabrication of semiconductor devices. Significant research has been focused on increasing the throughput and utility of metrology and/or inspection tools used to examine microscopic features and dimensions. There are several disadvantages, however, in using the currently available methods and systems for metrology and/or inspection of specimens fabricated by semiconductor fabrication processes. For example, testing time and process delays associated with measuring and/or inspecting a specimen may increase the overall cost of manufacturing and the manufacturing time for fabricating a semiconductor device. For example, process tools may often be idle while metrology and/or inspection of a specimen is performed such that the process may be evaluated before additional specimens are processed thereby increasing manufacturing delays. Furthermore, if processing problems cannot be detected before additional wafers have been processed, wafers processed during this time may need to be scrapped, which increases the overall cost of manufacturing.

BRIEF DESCRIPTION OF THE DRAWINGS

FIG. 3 is an example table comparing conventional metrology with the region-of-interest metrology disclosed herein.

FIG. 4 is a diagram showing problematic alignment correction when the position error frequency is higher than a relatively slow frame acquisition rate due to using conventional metrology.

FIG. 6 shows electron images of an example feature with ideal alignment and with shot noise preventing proper alignment.

SUMMARY

Figure 1:
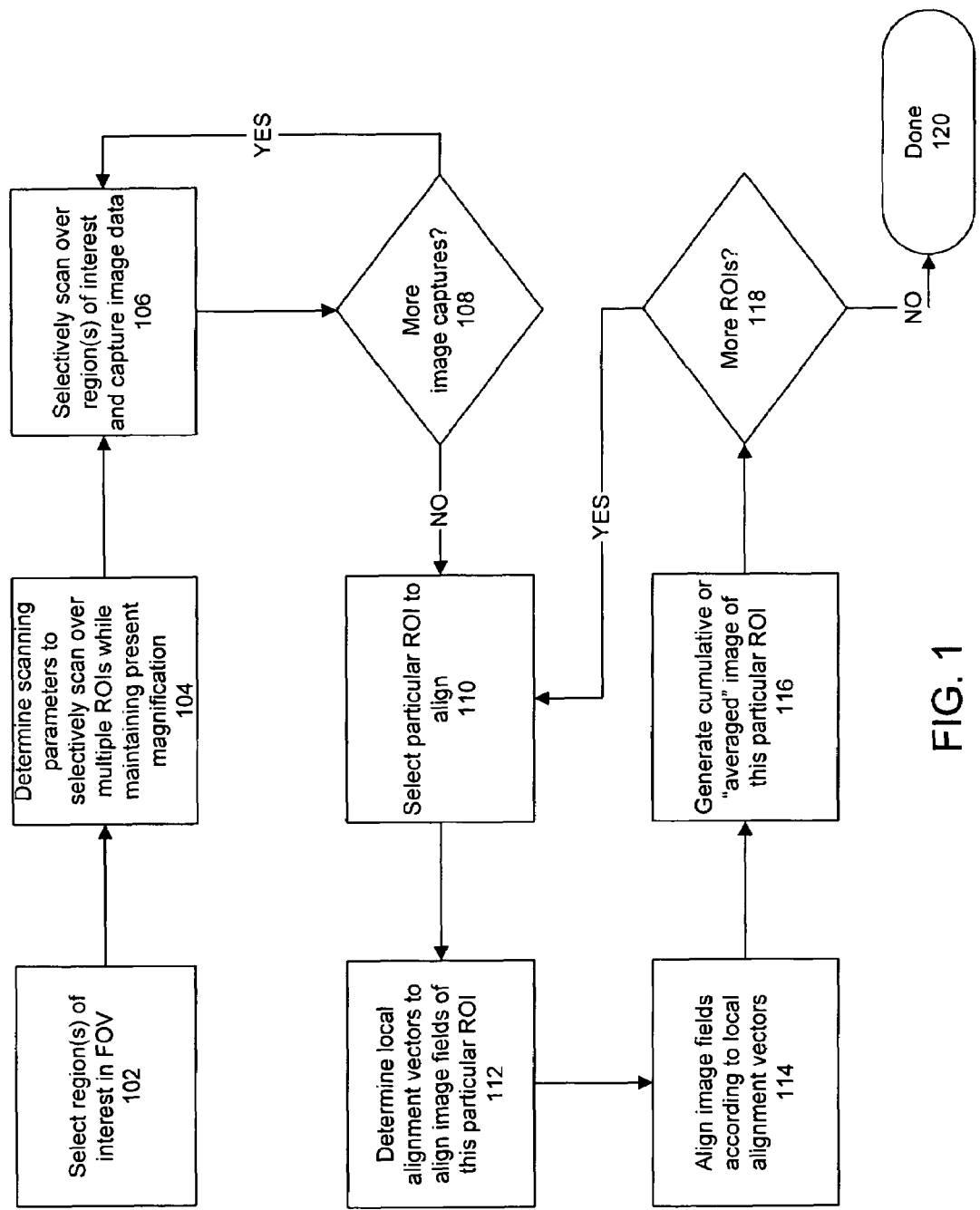
FIG. 1 is a flow chart depicting a method of electron beam metrology for regions of interest in a field of view in accordance with an embodiment of the invention.

One embodiment relates to a method for metrology using an electron beam apparatus. At least one region of interest is selected in a field of view at a magnification level. Scanning parameters are determined to selectively scan over the at least one regions of interest under the magnification level of the field of view. The electron beam is selectively scanned over the at least one region of interest to capture image data from the at least one region of interest while maintaining the magnification level of the field of view.

Other embodiments are also disclosed.

DETAILED DESCRIPTION

Noise and Alignment Problems for High-Precision Metrology

For CDSEM (critical dimension scanning electron microscopy) metrology, it is desirable to be able to make multiple measurements at a single stage position. The features to be measured by CDSEM typically span an area or field of view (FOV) several microns on each side.

Meanwhile, high precision metrology requires that data be collected with a pixel spacing which is near the precision requirement. Current precision requirements are typically a nanometer or less. Hence, the pixel spacing is required to be near a nanometer or less.

If a complete image frame is taken of a large area (several microns per side) with small pixels (spaced about a nanometer less apart), then a very large number of pixels are required. Acquiring such a large number of total pixels takes a disadvantageously long time. Such a long acquisition time degrades throughput of the CDSEM system and collects (integrates) more noise due to the longer collection interval.

In order to improve the signal-to-noise ratio, it is typical in a CDSEM for data from multiple image frames to be combined or "averaged" together before metrology analysis is performed. However, noise at frequencies near the single frame scan rate may cause distortion within an image so that there may be no single optimal alignment between the frames. In other words, there may be no single alignment between the image frames which allows them to be averaged together without blurring some part of the image. Blurred parts of the image are then unusable for purposes of accurate metrology.

Previous Techniques and Disadvantages Thereof

Previous techniques for improving the signal-to-noise ratio for high-precision metrology include varying the pixel spacing by changing the magnification to cover a smaller field while keeping the number of pixels constant. In other words, a smaller scan field is positioned at higher magnification over the region to be measured. By scanning a smaller field at a higher resolution, the number of pixels in the field is held constant.

Previous techniques for precisely aligning two image frames include analyzing the frames so as to find an alignment which results in a best fit over the entire image. Such alignment is then applied before the frames are "averaged" together.

These previous techniques have various disadvantages and problems. For example, with higher magnification, extra stage moves may be required to scan all the areas of interest. The extra stage moves result in a throughput degradation and also in the introduction of additional mechanical noise.

In addition, changing the magnification may result in systematic errors due to magnification-related variations in system calibrations. Changing the magnification may also result in systematic errors due to interactions between the system noise and the metrology algorithms which depend on pixel spacing.

Furthermore, applying an alignment over an entire image frame may disadvantageously result in blurring of part of the image. Such blurring would occur, for example, if the image frames are distorted differently by acoustic frequency input noise or by other causes.

Disclosed Techniques for Overcoming Noise and Alignment Problems

The present disclosure provides techniques for overcoming the above-discussed noise and alignment problems in high-precision CDSEM.

In accordance with one embodiment of the invention, the noise problems may be overcome by selectively scanning only the regions of interest in the image frame, while not varying the magnification of the instrumentation. This selective scanning technique allows collecting image data covering various areas while maintaining a constant pixel size. Advantageously, this technique avoids the need for extra stage moves, and minimizes the time required to collect images. In addition, this technique avoids the systematic errors due to changing the magnification or pixel spacing.

In accordance with another embodiment of the invention, the alignment problems may be overcome by dividing the total image frame into separate regions of interest, and aligning and averaging each region of interest independently from each other. This region-of-interest alignment technique advantageously avoids the blurring that may occur in parts of a conventionally averaged image.

FIG. 1 is a flow chart depicting a method 100 of electron beam metrology for regions of interest (ROIs) in a field of view in accordance with an embodiment of the invention. One or more region of interest within a field of view of the e-beam instrument may be selected 102. Each selected ROI is an area that is smaller than and contained within the FOV. The ROI should include one or more features to be measured. For example, such features may include a line or space width, a gap between two other features, a line-end pullback to be measured, corner rounding to be measured, or other features desired to be measured in a CDSEM instrument.

A determination 104 may then be made as to the scanning parameters to selectively scan over each selected ROI while the desired magnification is maintained. In other words, the magnification used to determine and obtain the FOV is maintained, and the parameters needed to scan just the ROIs are determined 104. For example, for a rectangular ROI, a scan origin point (scan offset), line segment length (region width), and number of lines (region height) to cover each ROI may be determined. Non-rectangular ROIs may also be selectively scanned.

Using these parameters, a selective scan is performed 106 over the ROIs and the resultant images fields are captured. Pixels outside the ROIs may preferably be bypassed by the scanning beam.

The selective scanning 106 of each ROI may be performed, for example, by progressive scanning starting at the scan origin point for that ROI. A first line segment of pixels starting at the scan origin and of said line length may be scanned to collect image data from pixels of that line segment. The beam may then be rapidly moved to the start point of the second line segment of pixels. Thereafter, the second line segment of pixels may be scanned to collect image data therefrom. The beam may then be rapidly moved to the start point of the third line segment of pixels. Thereafter, the third line segment of pixels starting at the next start point and of said line length may be scanned to collect image data therefrom. And so on until the area within the ROI has been selectively scanned 106.

Note that this technique of selectively scanning 106 the ROIs is performed while maintaining the magnification (i.e. the pixel spacing) used to obtain the desired FOV. In other words, the pixel spacing in the FOV is kept constant while performing the selective scanning 106 of the ROI. Advantageously, limiting the area scanned to the ROI minimizes the scanning of pixels which are not needed for the measurement. In addition, this technique avoids systematic errors in critical dimensional calculations caused by changing the magnification or pixel spacing.

A determination 108 may then be made as to whether more image field captures of the ROIs are desired. More than one image field capture of each ROI would typically be desired. If more image field captures are desired, then the selective scanning and image field capture 106 is repeated. For example, the method 100 may be configured to repeat the selective scanning so as to capture N image fields of each ROI in the FOV. In that case, the selective scanning 106 would be programmatically repeated N times.

When the image field captures are complete, then the method 100 may move on to alignment and averaging. In accordance with an embodiment of the invention, the ROIs may be aligned independently using local alignment vectors so as to avoid blurring which may occur when entire frames are aligned as per the conventional technique.

For example, a particular ROI may be selected 110 for alignment, and local alignment vectors for this particular ROI may be determined or calculated 112. The calculation 112 of a local alignment vector may be done, for example, by a least-squares difference or other type of fitting so as to find the local alignment vector which minimizes the difference between the image fields of that ROI. In other words, for each candidate vector, a type of difference calculation may be made to compare the pixel values of two image fields, and the candidate vector which minimizes the calculated difference may be determined to be the local alignment vector between the two image fields.

Using the calculated local alignment vectors, the captured image fields of this particular ROI may then be translated or "shifted" by the local vectors so as to align 114 the image fields. The aligned image fields may then be added together so as to generate 116 a cumulative or "averaged" image field of this particular ROI.

Independently generating the "averaged" image field of each ROI using local alignment vectors in accordance with this method 100 advantageously avoids the image blurring that may occur in conventional alignment techniques. In conventional techniques, entire frames (i.e. entire FOVs) are generally aligned using frame alignment vectors to create a cumulative or "averaged" image frame. Such an averaged image frame may include blurring of certain ROIs therein because the frame alignment vector applied to the entire image frame may not be optimal for each ROI therein.

Figure 2:
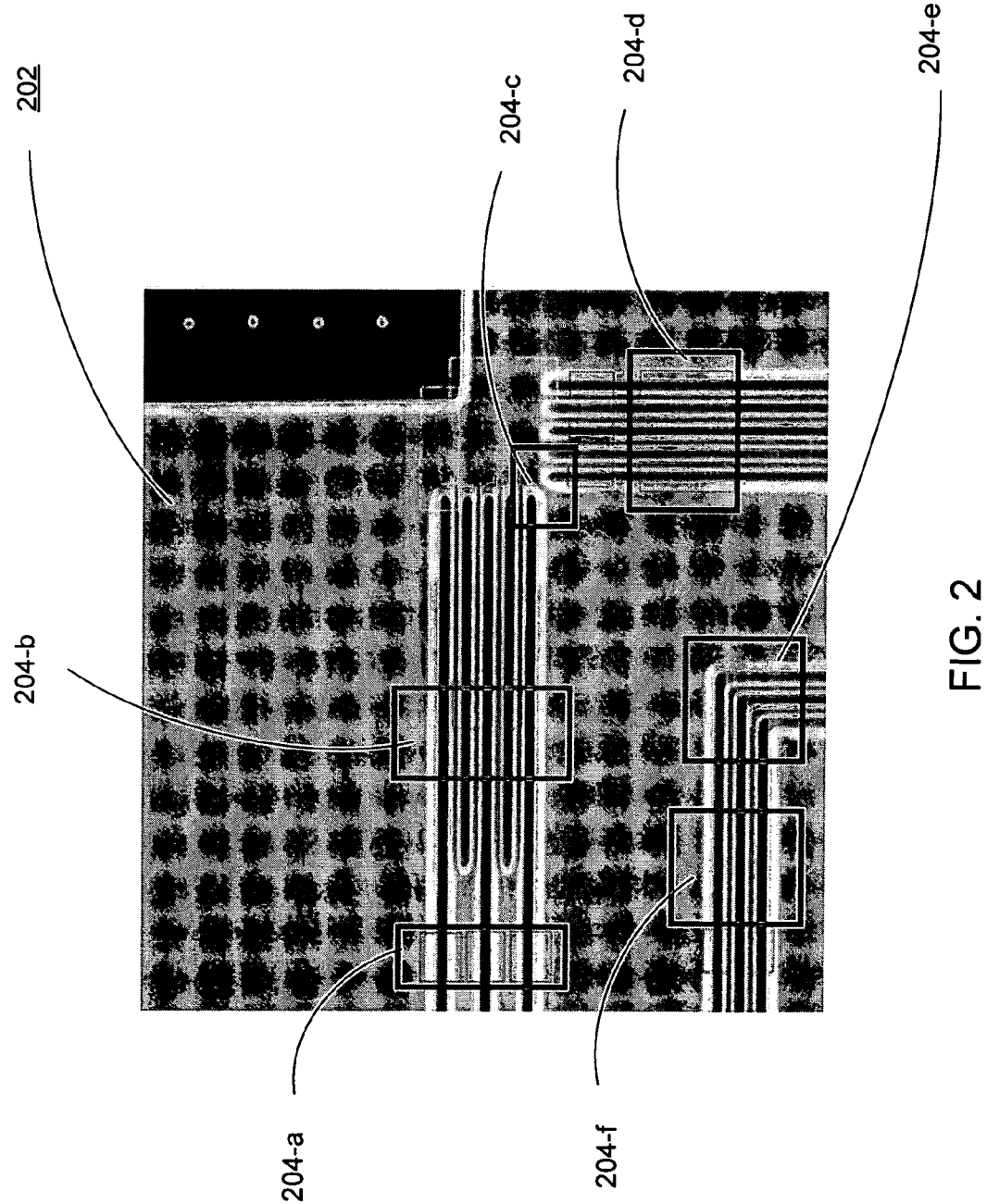
FIG. 2 is an example electron image showing multiple regions of interest within a field of view in accordance with an embodiment of the invention.

FIG. 2 is an example electron image showing multiple regions of interest 204 within a field of view (FOV) 202 in accordance with an embodiment of the invention. This example image shows six separate ROIs 204 selected within the FOV 202. Each ROI 204 may include one or more critical dimensions to be measured. For example, gaps between parallel lines may be measured in the ROIs labeled 204-a, 204-b, 204-d, and 204-f in FIG. 2. Line-end pull back may be measured in the ROI labeled 204-c and corner rounding of lines may be measured in the ROI labeled 204-e.

FIG. 3 is an example table comparing conventional metrology with the region-of-interest metrology disclosed herein. The table shows a typical field size of conventional metrology being 512×512 pixels for 256K total pixels. In comparison, an example field size of ROI metrology is shown as 64×64 pixels for only 4K total pixels per ROI measurement.

Due to the much less number of total pixels, the frame acquisition time and the total acquisition time are much shorter under ROI metrology. As shown in this example, the acquisition time is only 1/27 as long for ROI metrology compared to conventional metrology.

The ROI metrology technique significantly enhances throughput by decreasing the needed acquisition times. In addition, image blurring is reduced by reducing the windows of time over which vibrations and other noise influence image distortion and image alignment accuracy.

FIG. 4 is a diagram showing problematic alignment correction when the position error frequency is higher than a relatively slow frame acquisition rate due to using conventional metrology. A hypothetical position error 402 is shown as a sinusoidal signal for purposes of illustration. For example, the position error may be caused by vibration.

Here, the alignment correction 404 is performed relatively infrequently due to the relatively slow frame acquisition rate using conventional metrology. As such, when the position error 402 occurs too rapidly, the alignment correction 404 is not capable of changing rapidly enough to track the position error 402. Hence, a large discrepancy exists between the position error 402 and alignment correction 404 curves in FIG. 4.

Figure 5:
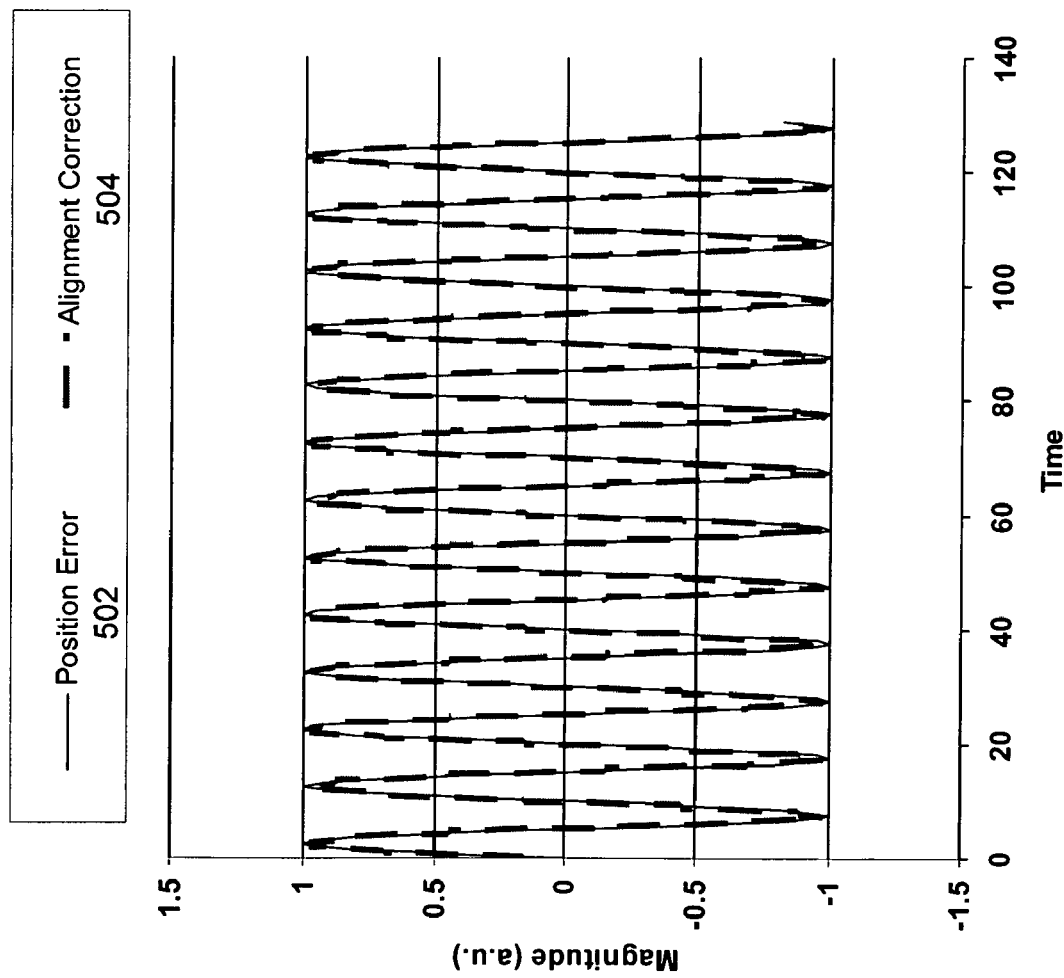
FIG. 5 is a diagram showing alignment correction with a higher frame acquisition rate using ROI metrology in accordance with an embodiment of the invention.

FIG. 5 is a diagram showing alignment correction with a higher frame acquisition rate using ROI metrology in accordance with an embodiment of the invention. Again, a hypothetical position error 502 is shown as a sinusoidal signal for purposes of illustration. For example, the position error may be caused by vibration.

Here, the alignment correction 504 may be performed frequently due to the faster acquisition rate using ROI metrology. As such, when the position error 502 occurs rapidly, the alignment correction 504 is capable of changing rapidly enough to track the position error 502. Hence, no large discrepancy exists between the position error 502 and alignment correction 504 curves in FIG. 5. This advantageously enables improved cancellation of vibration and shot-noise.

FIG. 6 shows electron images of an example feature with ideal alignment and with shot noise preventing proper alignment. The left image 602 shows an "averaged" image of an example round feature. The right image 604 shows an "averaged" image of the same example round feature with shot noise and vibration preventing proper alignment.

As discussed above, the conventional metrology technique sometimes results in the improper alignment and blurring as shown in the right image 604. In contrast, the ROI metrology technique disclosed herein may be used to achieve improved alignment with an aim to result in proper alignment as shown in the left image 602.

Figure 7:
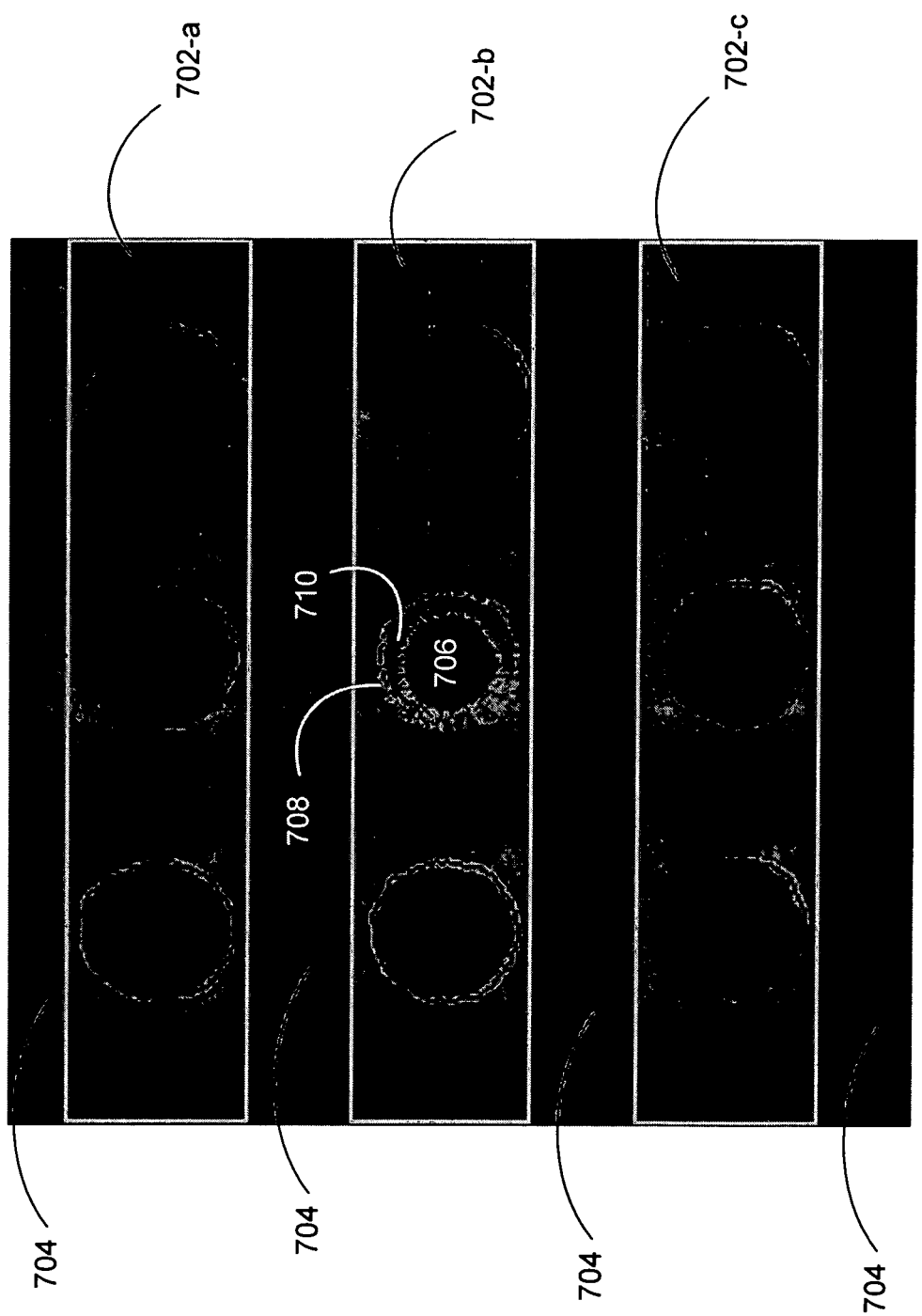
FIG. 7 is an electron image showing selected regions of interest for separate and independent alignment in accordance with an embodiment of the invention.

FIG. 7 is an electron image showing selected regions of interest 702 for separate and independent alignment in accordance with an embodiment of the invention. In this example, three rectangular regions of interest 702-a, 702-b, and 702-c are shown. Each region of interest 702 includes three round features therein. These ROIs 702 may be selectively scanned by the scanning beam as discussed above. Outside the ROIs 702 are areas 704 outside the ROIs. These areas 704 may be rapidly skipped over by the scanning beam as discussed above.

Also illustrated in FIG. 7 is a middle region 706 and an outer circumference 708 for one of the features. A band 710 is shown in between the central region 706 and the outer circumference 708. In one example, the width or area of this band 710 may comprise a critical dimension to be measured.

Figure 8:
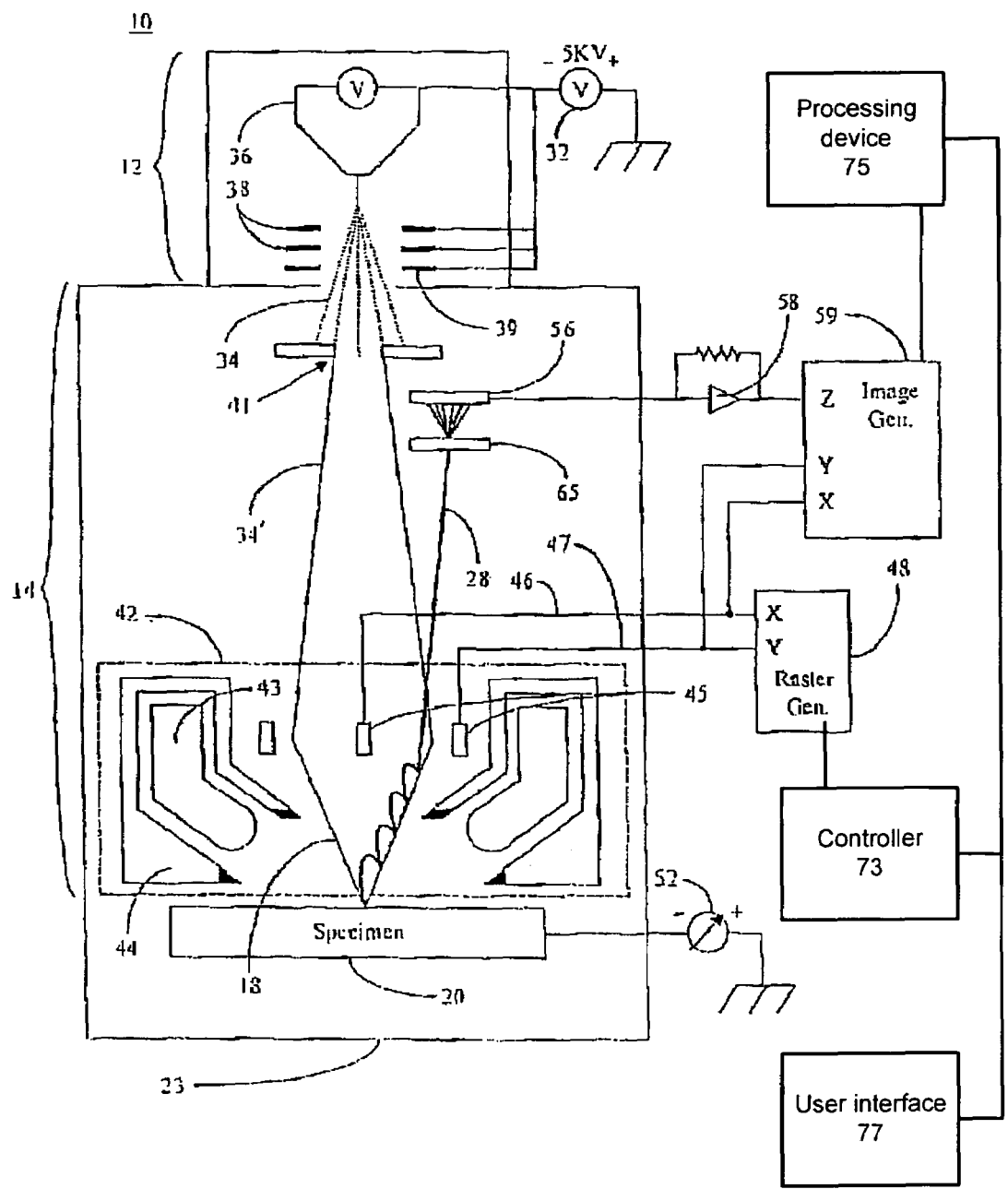
FIG. 8 shows a cross-sectional view of an example electron beam apparatus in accordance with an embodiment of the invention.

FIG. 8 shows a cross-sectional view of an example electron beam apparatus in accordance with an embodiment of the invention. As shown here, the apparatus 10 is shown with electron beam source 12 at the top which produces electron beam 34. One implementation that could be used includes an electron gun 36 that consists of a thermal field emitter (TFE) with the electrons accelerated by a surface field generated by power supply 32. Alternative electron gun embodiments could be employed. The electrons emitted by electron gun 36 are then, within beam source 12, directed through electrodes 38 and gun lens 39 (each also controlled by power supply 32) to form electron beam 34 that enters focusing column and lens assembly 14 to be directed to specimen 20. It should also be noted that electrodes 38 typically include both suppressor and extractor electrodes.

In focusing column and lens assembly 14, electron beam 34 passes through an aperture 41, reducing the beam current and forming what is labeled electron beam 34'. Electron beam 34' then passes through objective lens 42, including magnetic coils 43 and pole pieces 44, that generate a strong magnetic field. That magnetic field is used to focus beam 34' to form electron beam 18 with a small spot size when directed at specimen 20.

The location of electron beam 18 is controlled with scan devices 45, located within the magnetic field created by coils 43 and pole pieces 44. The scan devices 45 are powered by raster generator 48 to direct beam 18 in both the x and y directions across specimen 20 by signals on lines 46 and 47, respectively.

In accordance with one embodiment of the invention, the scan devices 45 comprise magnetic deflectors. However, using such magnetic scanners to perform selective scanning of regions of interest may create eddy currents which may be problematic. Alternatively, in accordance with another embodiment of the invention, the scan devices 45 may comprise electrostatic deflectors to avoid problems due to eddy currents.

Secondary and backscatter electrons 28 are released as a result of the interaction of electron beam 18 with specimen 20 and are directed back toward lens 42. As electrons 28 are released, they spiral through lens 42 as a result of the magnetic field, and then travel toward detector 65 as they leave the field within lens 42. The electron signal received by detector 65 is then collected by collector plate 56 which in-turn generates a signal that is amplified by amplifier 58 before being applied to image generator 59. Other input signals to image generator 59 are signals x and y from raster generator 48 on lines 46 and 47, respectively, to form a video signal representing an image of specimen 20, or selected portions thereof. Electron beam source 12, focusing column and lens assembly 14, and specimen 20 are all contained within a vacuum chamber 23.

Note that when a high electron beam current 18 is used, the integration time for detector 65 to achieve a given signal-to-noise ratio for an image is reduced. However, the electron beam current 18 is limited because too high a current 18 may alter or damage the surface being measured.

In accordance with an embodiment of the invention, the raster generator 48 may be controlled by a controller 73 (control software or circuitry) so as to implement the selective scanning of the regions of interest as discussed above. The image generator 59 may be configured so as to store captured image fields from the selective scanning of the regions of interest. A processing device 75 coupled to the image generator may be configured to perform the aligning and averaging steps disclosed above. The processing device 75 may also be configured to analyze the averaged image data with algorithms to determine critical dimensions of features within the regions of interest.

A user interface 77 may be used to allow a user to specify regions of interest within a field of view. Alternatively, the regions of interest may be automatically determined using image processing algorithms in an automated apparatus. The user interface 77 may also be used to interface with the processing device 75.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A method for metrology using an electron beam apparatus, the method comprising:
    selecting multiple regions of interest within an original field of view, wherein the multiple regions of interest correspond to sub-areas of the original field of view;
    determining scanning parameters to selectively scan over said sub-areas at a same level of magnification as the original field of view; and
    selectively scanning the electron beam over said sub-areas while maintaining the original field of view to efficiently capture image data from the multiple regions of interest, wherein a total number of pixels in said sub-areas is a fraction of a number of pixels in the original field of view.

2. The method of claim 1, wherein the scanning parameters comprise an origin, height and width of each region of interest.

3. The method of claim 1, further comprising independently aligning the image data from said sub-areas and generating cumulative or averaged image data from said aligned image data, wherein each said sub-area includes a same feature which has a critical dimension that is being measured.

4. The method of claim 1, wherein the selective scanning over said sub-areas is performed using a magnetic scan deflector.

5. The method of claim 1, wherein the selective scanning over said sub-areas is performed using an electrostatic scan deflector.

6. An electron beam metrology apparatus, the apparatus comprising:
    means for selecting multiple regions of interest in an original field of view, wherein the multiple regions of interest correspond to sub-areas of the original field of view;
    means for determining scanning parameters to selectively scan over said sub-areas at a same level of magnification as the original field of view; and
    means for selectively scanning the electron beam over said sub-areas while maintaining the original field of view to efficiently capture image data from the multiple regions of interest, wherein a total number of pixels in said sub-areas is a fraction of a number of pixels in the original field of view.

7. The apparatus of claim 6, wherein the scanning parameters comprise an origin, height and width of each region of interest.

8. The apparatus of claim 6, further comprising a processing device configured to align the image data from said sub-areas and to generate cumulative or averaged image data from said aligned image data, wherein each said sub-area includes a same feature which has a critical dimension that is being measured.

9. The apparatus of claim 6, wherein the selective scanning over said sub-areas is performed using a magnetic scan deflector.

10. The apparatus of claim 6, wherein the selective scanning over said sub-areas is performed using an electrostatic scan deflector.

11. The apparatus of claim 6, wherein the selective scanning is performed using a combination of magnetic and electrostatic scan deflectors.

\* \* \* \* \*